United States Patent [19]
Ohshima

[11] Patent Number: 5,268,595
[45] Date of Patent: Dec. 7, 1993

[54] VOLTAGE DETECTOR FOR PRODUCING OUTPUT SIGNAL WITHOUT TRANSIENT ERROR LEVEL

[75] Inventor: Yoshinobu Ohshima, Tokyo, Japan

[73] Assignee: NEC Corporation, Tokyo, Japan

[21] Appl. No.: 850,431

[22] Filed: Mar. 12, 1992

[30] Foreign Application Priority Data

Mar. 20, 1991 [JP] Japan .................................. 3-55306

[51] Int. Cl.[5] ............................................ H03K 5/153
[52] U.S. Cl. ............................... 307/362; 328/149; 307/542
[58] Field of Search .............. 328/146, 147, 148, 149; 307/540, 542, 552, 553, 554, 555, 558, 362, 363

[56] References Cited

U.S. PATENT DOCUMENTS

| | | | |
|---|---|---|---|
| 3,474,258 | 10/1969 | Nagy, Jr. ................... | 328/146 |
| 3,581,218 | 5/1971 | Ransdell .................. | 328/146 |
| 4,015,141 | 3/1977 | Reiter ...................... | 328/148 |
| 4,634,902 | 6/1987 | Tanaka et al. ............ | 307/542 |
| 5,119,016 | 6/1992 | Seger ....................... | 307/542 |

*Primary Examiner*—John S. Heyman
*Assistant Examiner*—Shawn Riley

[57] ABSTRACT

A voltage detector monitors a power voltage level to see whether or not the power voltage level exceeds a predetermined voltage level, and comprises a reference voltage producing circuit for producing a reference voltage level proportional to the predetermined voltage level, a monitored voltage producing circuit for producing a monitored voltage level proportional to the power voltage level, a voltage comparator operative to compare the monitored voltage level with the reference voltage level for producing an output signal indicative of status of the power voltage level, and a combination of a clamping resistor and a resistor provided in association with the voltage comparator for forcibly fixing the output signal to an inactive level until the power voltage level is sufficiently increased so that the voltage comparator never produces any error output signal.

5 Claims, 5 Drawing Sheets

VOLTAGE DETECTOR FOR PRODUCING OUTPUT SIGNAL WITHOUT TRANSIENT ERROR LEVEL

FIELD OF THE INVENTION

This invention relates to a voltage detector and, more particularly, to a voltage detector for monitoring a power voltage level to see whether or not the power voltage level is decayed under a predetermined level.

DESCRIPTION OF THE RELATED ART

A typical example of the voltage detector is illustrated in FIG. 1, and comprises a voltage comparator 1, a reference voltage producing circuit 2 for supplying a reference voltage level Vref to the voltage comparator 1, and a monitored voltage producing circuit 3 for supplying a monitored voltage level Vm to the voltage comparator 1. The reference voltage producing circuit 2 is implemented by a series combination of a resistor R1 and a zener diode D1 coupled between a power voltage line 4 and a ground voltage line GND, and the reference voltage level Vref is produced at a reference node N1 between the resistor R1 and the zener diode D1. The monitored voltage producing circuit 3 is implemented by a series combination of resistors R2 and R3 coupled between the power voltage line 4 and the ground voltage line GND, and the monitored voltage level Vm is produced at a monitored node N2 between the resistors R2 and R3. The voltage comparator 1 compares the monitored voltage level Vm with the reference voltage Vref, and supplies an output signal Sout at an output node OUT1. The output signal Sout is indicative of the relation between the reference voltage level Vref and the monitored voltage level Vm.

Assuming now that the power voltage line 4 gives rise to increase a power voltage level Vp as shown in FIG. 2, the reference voltage level Vref is increased together with the power voltage level Vp, and the monitored voltage producing circuit 3 keeps the monitored voltage level Vm lower than the power voltage level Vp. If the power voltage level Vp exceeds a breakdown voltage level Vd at time t2, the reference voltage producing circuit 2 fixes the reference voltage level Vref to the breakdown voltage level. The power voltage level Vp continues to be increased with time, and the monitored voltage level Vm exceeds the reference voltage level Vref at time t3. Then, the output signal Sout is elevated from the ground voltage level to the power voltage level Vp, and the power voltage level Vp and the output signal Sout are increased together. The reference voltage level Vref is kept at the breakdown voltage level Vd regardless of the power voltage level Vp, and the monitored voltage level Vm is also increased.

On the other hand, the power voltage line 4 gives rise to decrease the power voltage level Vp at time t4, and the monitored voltage level Vm follows the power voltage level Vp. If the monitored voltage level Vm becomes lower than the reference voltage level Vref or the breakdown voltage level Vd at time t5, the output signal Sout is rapidly decayed from the power voltage level Vp to the ground voltage level. The power voltage level Vp reaches the reference voltage level Vref or the breakdown voltage level Vd at time t6, and the zener diode D1 does not allow current to flow therethrough. Then, the reference voltage level Vref is decayed together with the power voltage level Vp, and all the voltage levels finally reach the ground voltage level.

Thus, the voltage comparator 1 monitors the monitored voltage level Vm and, accordingly, the power voltage level Vp to see whether or not the power voltage level Vp is available for an associated electric circuit without any trouble.

However, a problem is encountered in the prior art voltage detector in that the output signal Sout is transiently changed from the ground level to a positive voltage level as labeled with X1 and X2 in FIG. 2. This is because of the fact that component transistors of the voltage comparator 1 are unstable in the power voltage level Vp close to the ground voltage level GND.

SUMMARY OF THE INVENTION

It is therefore an important object of the present invention to provide a voltage detector which is free from transient voltage lift.

To accomplish the object, the present invention proposes to forcibly fix an output signal to an inactive level while component transistors are unstable.

In accordance with the present invention, there is provided a voltage detector for monitoring a target voltage level to see whether or not the target voltage signal exceeds a predetermined voltage level, comprising: a) a reference voltage producing circuit coupled between a first voltage line for the target voltage signal and a second voltage line substantially constant in voltage level, and operative to produce a reference signal substantially proportional in voltage level to the target voltage signal while the target voltage signal is lower than the reference voltage level, the reference voltage signal being substantially constant at the reference voltage level after the target voltage signal is approximately equal to or higher than the reference voltage level, the reference voltage level being proportional to the predetermined voltage level; b) a monitored voltage level producing circuit coupled between the first voltage line and the second voltage line, and operative to produce a monitored voltage signal substantially proportional in voltage level to the target voltage signal, c) a voltage comparator operative to compare the monitored voltage signal with the reference voltage signal, and producing an output signal indicative of whether or not the target voltage signal exceeds the predetermined voltage level; and d) a prohibiting means provided in association with the voltage comparator, and operative to forcibly fix the output signal to an inactive level while the voltage comparator is unstable in operation.

BRIEF DESCRIPTION OF THE DRAWINGS

The feature and advantages of the voltage detector according to the present invention will be more clearly understood from the following description taken in conjunction with the accompanying drawings in which.

DESCRIPTION OF THE PREFERRED EMBODIMENTS

First Embodiment

Figure 1:
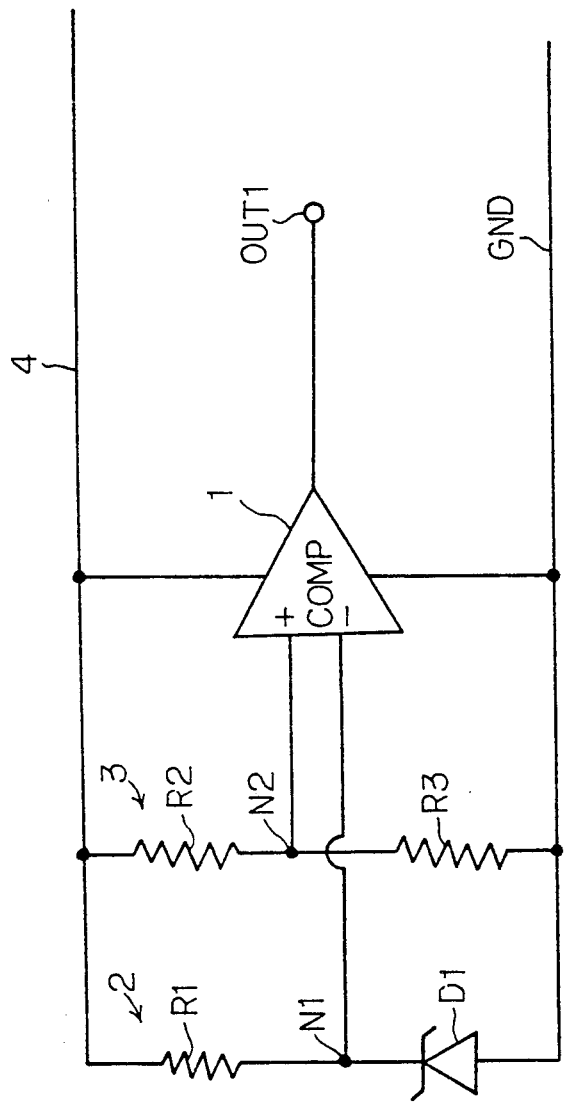
FIG. 1 is a circuit diagram showing the arrangement of the prior art voltage detector.
Figure 2:
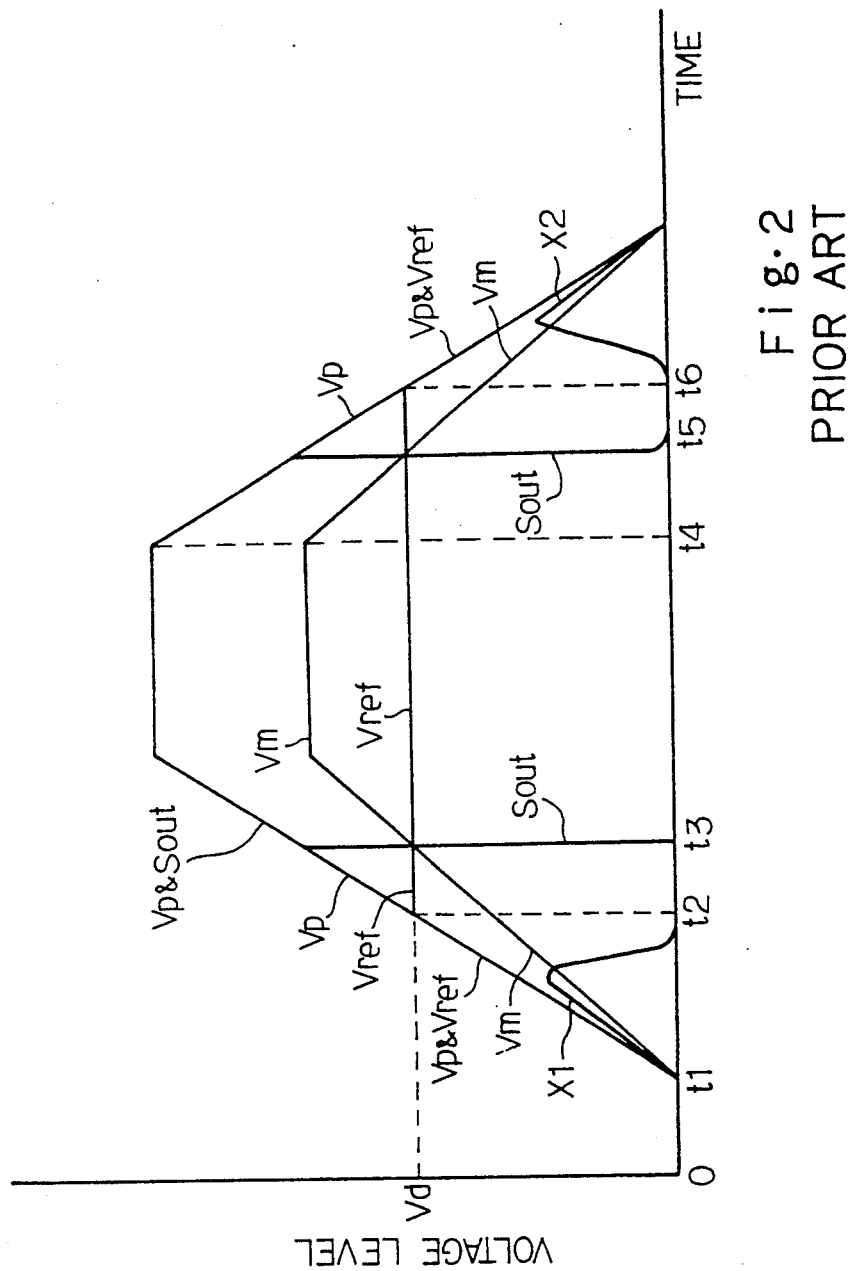
FIG. 2 is a graph showing the circuit behavior of the prior art voltage detector.
Figure 3:
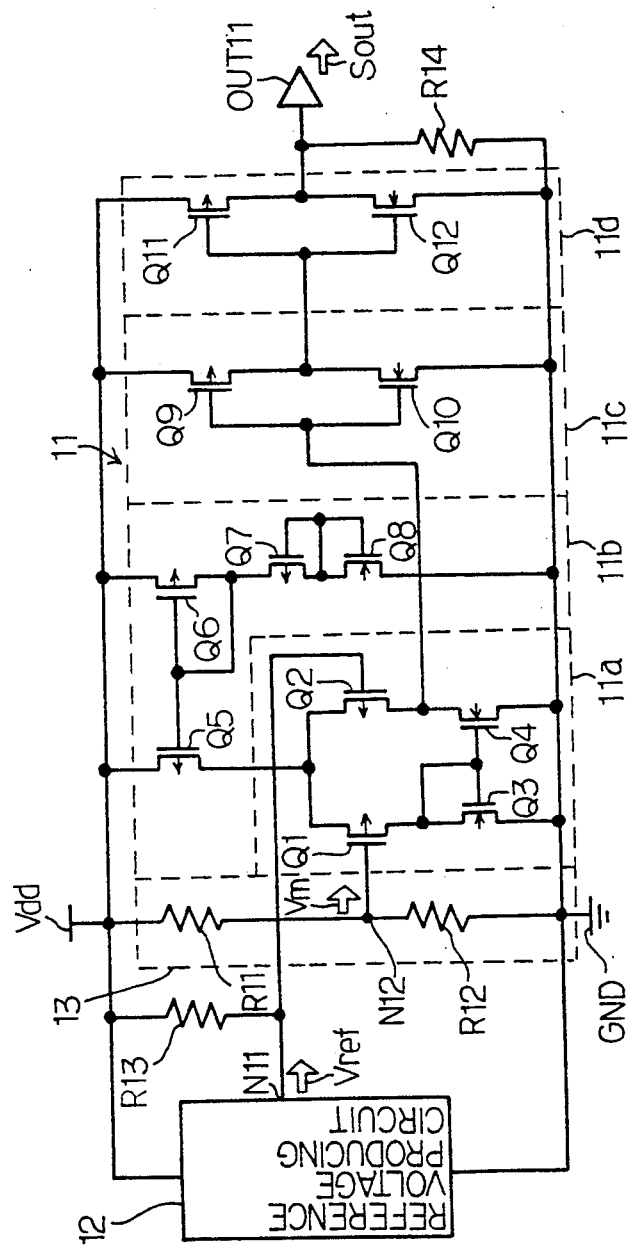
FIG. 3 is a circuit diagram showing the arrangement of a voltage detector according to the present invention.

Referring first to FIG. 3 of the drawings, a voltage detector embodying the present invention largely comprises a voltage comparator 11 coupled between a power voltage line Vdd and a ground voltage line GND, a reference voltage producing circuit 12 coupled between the power voltage line Vdd and the ground voltage line GND and operative to produce a reference voltage level Vref at a reference node N11, and a monitored voltage producing circuit 13 coupled between the power voltage line Vdd and the ground voltage line GND and operative to produce a monitored voltage level Vm proportional to a power voltage level Vp at a monitor node N12.

Though not shown in detail, the reference voltage producing circuit 12 is implemented by a p-n-p band-gap structure, because it is difficult for MOS technology to produce a zener diode. While the power voltage level Vp is lower than a critical level Vc inherent in the p-n-p band-gap structure, the reference voltage producing circuit 12 gives rise to increase the reference voltage level Vref together with the power voltage level Vp on the power voltage line Vdd. However, after the power voltage level Vp exceeds the critical level Vc, the reference voltage producing circuit 12 keeps the reference node N11 in the reference voltage level Vref in the critical level Vc.

The monitored voltage producing circuit 13 is implemented by a series combination of resistors R11 and R12, and the monitored voltage level Vm is given as $$Vm = Vp \times r12/(r11 + r12) \qquad \text{Equation 1}$$

where R11 and r12 are resistances of the resistors R11 and R12.

The voltage comparator 11 largely comprises an input differential amplifier stage 11a, a constant current source 11b, an inverter stage 11c, and an output driver stage 11d. The input differential amplifier stage 11a is implemented by field effect transistors Q1 to Q4, and field effect transistors Q5 to Q8 constitute the constant current source 11b. The inverter stage 11c is implemented by a series combination of field effect transistors Q9 and Q10, and the output driver stage 11d is also implemented by a series combination of field effect transistors Q11 and Q12. The output driver stage 11d drives an output node OUT11, and an output signal Sout takes place at the output node OUT11.

The voltage detector implementing the first embodiment further comprises a clamping resistor R13 and a clamping resistor R14, and the resistors R13 and R14 as a whole constitute a prohibiting means. The clamping resistor R13 is coupled between the power voltage line Vdd and the reference node N11, and the clamping resistor R14 is coupled between the output node OUT11 and the ground voltage line GND.

Figure 4:
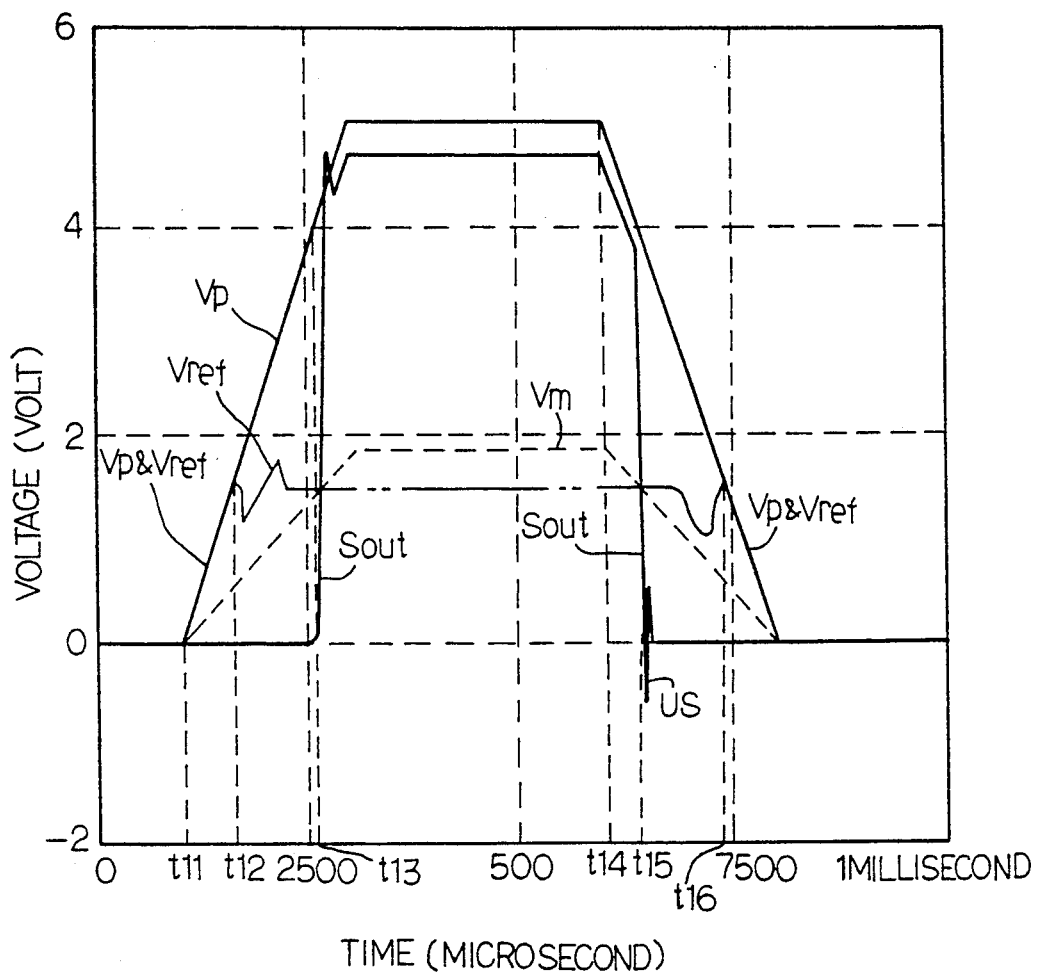
FIG. 4 is a graph showing the circuit behavior of the voltage detector shown in FIG. 3.

Description is hereinbelow made on the circuit behavior of the voltage detector with reference to FIG. 4, and the voltage detector is assumed to invert the output signal Sout upon voltage drop to 4.0 volts. The critical level Vc is adjusted to 1.5 volts, and resistances r11 and r12 are calculated from Equation 1. When the power voltage level Vp reaches 4.0 volts, the monitored voltage level Vm should be 1.5 volts. Equation 1 is $$1.5 = 4.0 \times r12 / (r11 + r12)$$

Therefore, r11 is $(5/3)r12$.

The power voltage line Vdd starts on increasing the power voltage level Vp from the ground voltage level at time t11, and reaches the critical level Vc at time t12. The reference voltage level Vref is fixed to the critical level Vc. The output signal Sout remains in the ground voltage level between time t11 and time t12, and no error level takes place. This is because of the fact that the reference node Vref is clamped to the power voltage level Vp by means of the clamping resistor R13. However, the monitored voltage level Vm is surely lower than the power voltage level Vp, and the reference node N11 of the power voltage level Vp prevents the voltage comparator 11 from unstable state. In general, field effect transistors become stable around the power voltage level Vp at about 2.0 volts, and the voltage comparator 11 never makes error thereafter.

The power voltage level exceeds 4.0 volts at time t13, and the monitored voltage level Vm also exceeds the critical level Vc. Then, the voltage comparator 11 inverts the output signal Sout, and the output signal Sout is elevated to a positive high voltage level slightly lower than the power voltage level Vp due to the clamping resistor R14.

The power voltage level Vp is decayed from time t14, and the monitored voltage level Vm becomes lower than the reference voltage level Vref at time t15. Then, the output signal Sout is rapidly decayed toward the ground voltage level, and undershoot US takes place. However, the output signal Sout is quickly recovered to the ground voltage level, and is clamped at the ground voltage level by virtue of the clamping resistor R14. The power voltage level Vp reaches the critical level Vc at time t16, and the reference voltage level Vref is decreased together with the power voltage level Vp. However, the output signal Sout is still clamped at the ground voltage level, and any error level does not take place.

As will be appreciated from the forgoing description, while the power voltage level Vp is too low to make the component field effect transistors Q1 to Q12 of the voltage comparator 11 stable, the clamping resistors R13 and R14 prevent the output signal Sout from error level, and the voltage detector according to the present invention is reliable.

Second Embodiment

Figure 5:
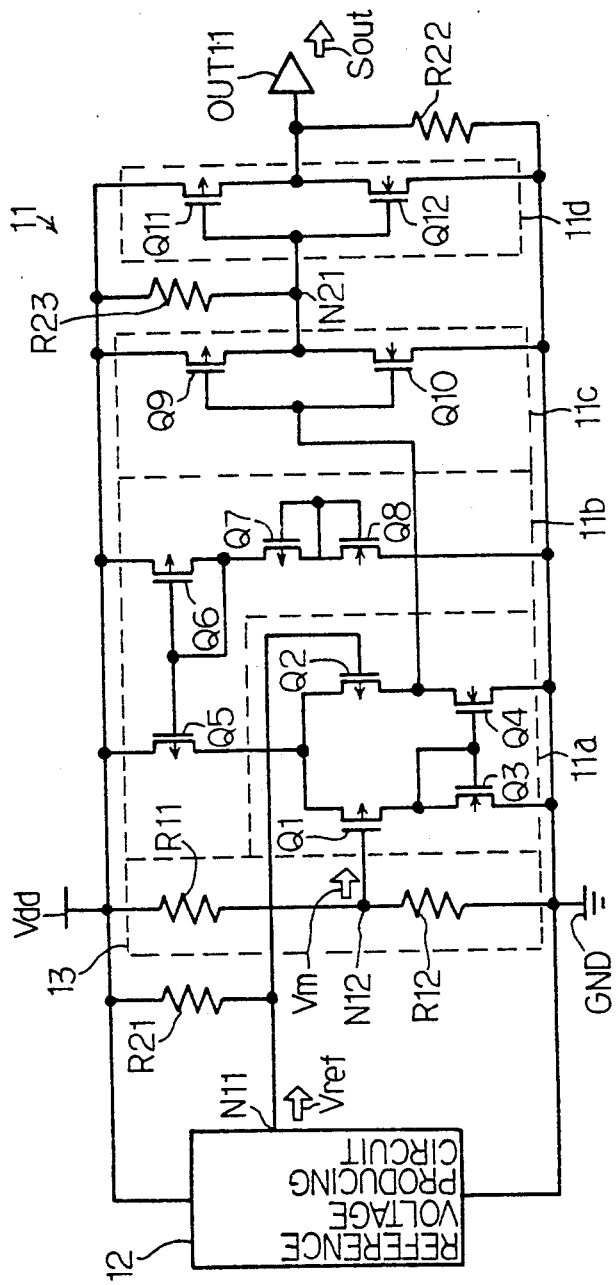
FIG. 5 is a circuit diagram showing the arrangement of another voltage detector according to the present invention.

Turning to FIG. 5 of the drawings, another voltage detector embodying the present invention is illustrated. The voltage detector implementing the second embodiment is similar in circuit arrangement to the first embodiment except for prohibiting means, and circuit components are labeled with the same references used in FIG. 3 without any detailed description.

The prohibiting means of the second embodiment is implemented by three clamping resistors R21, R22 and R23. The clamping resistor R21 is coupled between the power voltage line Vdd and the reference node N11, and is corresponding to the clamping resistor R13. The clamping resistor R22 is coupled between the output node OUT11 and the ground voltage line GND, and is corresponding to the clamping resistor R14. The clamping resistor R23 is newly added between the power voltage line Vdd and the input node N21 of the output driver stage 11d, and the clamping resistor R23 makes the output signal Sout stable. In detail, the inverter stage 11c and the output driver stage 11d are assumed to respectively have the minimum operational voltage levels Vmin1 and Vmin2, and the output signal Sout becomes unstable if Vmin1 is larger than Vmin2. However, the clamping resistor R23 pulls up the input node N21, and causes the inverter stage 11c and the output driver stage 11d to be stable. Therefore, the output signal Sout is much more reliable even if the power voltage level Vp is too low to make the component field effect transistors Q1 to Q12 stable.

Although particular embodiments of the present invention have been shown and described, it will be obvious to those skilled in the art that various changes and modifications may be made without departing from the spirit and scope of the present invention.

What is claimed is:

1. A voltage detector for monitoring a target voltage level to determine whether or not said target voltage signal exceeds a predetermined voltage level, comprising:
   a) a reference voltage producing circuit coupled between a first voltage line for said target voltage signal and a second voltage line substantially constant in voltage level, and operative to produce a reference signal substantially proportional in voltage level to said target voltage signal while said target voltage signal is lower than said reference voltage level, said reference voltage signal being substantially constant at said reference voltage level after said target voltage signal is approximately equal to or higher than said reference voltage level, said reference level being proportional to said predetermined voltage level;
   b) a monitored voltage level producing circuit coupled between said first voltage line and said second voltage line, and operative to produce a monitored voltage signal substantially proportional in voltage level to said target voltage signal;
   c) a voltage comparator unstable in operation below a predetermined voltage level, and operative to compare said monitored voltage signal with said reference voltage signal for producing an output signal indicative of whether or not said target voltage signal exceeds said predetermined voltage level; and
   d) a prohibiting means provided in association with said voltage comparator, and operative to forcibly fix said output signal to an inactive level while said voltage comparator is unstable in operation, said prohibiting means comprising a first clamping resistor coupled between said first voltage line and an output node of said reference voltage producing circuit, and a second clamping resistor coupled between an output node of said voltage comparator and said second voltage line.

2. A voltage detector as set forth in claim 1, in which said target voltage signal is a power voltage.

3. A voltage detector as set forth in claim 1, in which said voltage comparator comprises an input differential stage supplied with said reference voltage signal and said monitored voltage signal and coupled through a constant current source with said first voltage line and with said second voltage line, an inverter stage coupled between said first voltage line and said second voltage line and having an input node coupled with an output node of said input differential stage, and an output driver stage coupled between said first voltage line and said second voltage line and having an input node coupled with an output node of said inverter stage.

4. A voltage detector as set forth in claim 3, in which said prohibiting means further comprises a third clamping resistor coupled between said first voltage line and said output node of said inverter stage.

5. A voltage detector as set forth in claim 4, in which said target voltage signal is a power voltage level.

* * * * *